(12) United States Patent
Kibune

(10) Patent No.: US 7,859,300 B2
(45) Date of Patent: Dec. 28, 2010

(54) INPUT AND OUTPUT CIRCUIT APPARATUS

(75) Inventor: Masaya Kibune, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/541,633

(22) Filed: Aug. 14, 2009

(65) Prior Publication Data

US 2009/0302922 A1    Dec. 10, 2009

Related U.S. Application Data

(63) Continuation of application No. PCT/JP2007/053308, filed on Feb. 22, 2007.

(51) Int. Cl.
*H03K 19/003* (2006.01)
*H03K 19/0175* (2006.01)

(52) U.S. Cl. .............. 326/33; 326/82; 326/86

(58) Field of Classification Search ........... 326/33, 326/31, 21, 82, 83, 86; 327/108, 109, 333
See application file for complete search history.

(56) References Cited

U.S. PATENT DOCUMENTS

| | | | |
|---|---|---|---|
| 5,568,068 A * | 10/1996 | Ota et al. ............ | 326/82 |
| 6,023,174 A * | 2/2000 | Kirsch ............ | 326/34 |
| 7,088,160 B2 * | 8/2006 | Harms et al. ............ | 327/175 |
| 2002/0005743 A1 | 1/2002 | Tanaka | |
| 2004/0100838 A1 | 5/2004 | Tamura et al. | |

FOREIGN PATENT DOCUMENTS

| | | |
|---|---|---|
| JP | 2002-026712 A | 1/2002 |
| JP | 2004-030338 A | 1/2004 |
| JP | 2004-172980 A | 6/2004 |
| JP | 2005-217949 A | 8/2005 |

* cited by examiner

*Primary Examiner*—James Cho
(74) *Attorney, Agent, or Firm*—Arent Fox LLP

(57) ABSTRACT

An input and output circuit apparatus includes a signal generating circuit configured to generate a first signal, an input and output circuit configured to receive the first signal from the signal generating circuit and a second signal to generate an output signal responsive to the first signal and the second signal, an operation test circuit having substantially an identical circuit configuration to the input and output circuit, and configured to receive the first signal from the signal generating circuit and a third signal to generate an output signal responsive to the first signal and the third signal, a check circuit configured to generates a check signal indicative of an operating condition of the operation test circuit in response to the output signal of the operation test circuit, and an adjustment circuit configured to adjust the signal generating circuit in response to the check signal output from the check circuit.

10 Claims, 15 Drawing Sheets

INPUT AND OUTPUT CIRCUIT APPARATUS

CROSS-REFERENCE TO RELATED APPLICATIONS

This is a continuation of International Application No. PCT/JP2007/053308, filed on Feb. 22, 2007, the entire contents of which are hereby incorporated by reference.

FIELD

The present embodiment generally relates to signal transmission technologies, and relates to an input and output circuit for inputting and outputting transmission signals.

BACKGROUND

There is a demand to increase transmission speed with respect to signal transmission between circuit blocks within a chip, signal transmission between LSI chips, and/or signal transmission between boards and/or housings. In order to increase signal transmission speed, clock and bias signals applied to an input and output circuit that inputs and outputs transmission signals may need to be optimized.

For the purpose of attaining high-speed operation, generally, a clock signal having small amplitude that entails a small dead time is desirable. When generating a small-amplitude clock signal, the center voltage and amplitude may need to be adjusted to proper values to avoid unstable circuit operations. The use of insufficiently small clock signal amplitude, for example, may give rise to a problem in that the circuit is not operational.

FIG. 1 is a drawing illustrating an example of the configuration of a related-art circuit for adjusting to an optimum value the center voltage of a clock signal input into an input and output circuit. A circuit of FIG. 1 includes an input and output circuit 10, a waveform detecting circuit 11, a waveform comparing circuit 12, an adjustment circuit 13, a clock buffer 14, and an ideal waveform generating circuit 15. This circuit is disclosed in Patent Document 1.

The clock buffer 14 is configured to adjust the center voltage of a clock signal clk that is output therefrom. The input and output circuit 10 receives data signal "data" in response to the clock signal clk supplied from the clock buffer 14, and outputs the received data signal "data".

The waveform detecting circuit 11 detects the center voltage of the clock signal clk supplied to the input and output circuit 10. The ideal waveform generating circuit 15 generates a reference voltage equal to the center voltage of a clock signal clk that is expected to cause the circuit to properly operate. The waveform comparing circuit 12 calculates a difference between the reference voltage and the center voltage of the clock signal detected by the waveform detecting circuit 11, and supplies a signal indicative of this difference to the adjustment circuit 13. In response to the difference indicated by the received signal, the adjustment circuit 13 adjusts operating parameters of the clock buffer 14 to perform such feedback control that the difference becomes zero. This feedback control ensures that the input and output circuit 10 receives a clock signal clk that has a proper center voltage.

In the configuration described above, however, there is no guarantee that the input and output circuit 10 properly operates with absolute certainty even if a clock signal clk having the same center voltage as the reference voltage generated by the ideal waveform generating circuit 15 is supplied to the input and output circuit 10. For example, the input and output circuit 10 may have manufacturing variation, so that the center voltage of its optimum clock signal may be different from the expected voltage. Even if there is no manufacturing variation with respect to the input and output circuit 10, manufacturing variation in the ideal waveform generating circuit 15 may cause an error in the reference voltage, resulting in an operation failure.

In consideration of this, provision may be made to detect the output of the input and output circuit 10 to check the operation of the input and output circuit 10. In such a case, it is easy to check the operation of the input and output circuit 10 if the input/output signal "data" of the input and output circuit 10 is a periodic signal that exhibits regular transitions such as a clock signal. However, the input/output signal "data" of the input and output circuit 10 may be an ordinary data signal. It is then not guaranteed that this signal output exhibits a transition within a predetermined time period. It is thus not possible to check, solely based on the signal output, whether the input and output circuit 10 is properly operating.

[Patent Document 1] Japanese Patent Application Publication No. 2004-172980

SUMMARY

According to an aspect of the embodiment, an input and output circuit apparatus includes a signal generating circuit configured to generate a first signal, an input and output circuit configured to receive the first signal from the signal generating circuit and a second signal to generate an output signal responsive to the first signal and the second signal, an operation test circuit having substantially an identical circuit configuration to the input and output circuit, and configured to receive the first signal from the signal generating circuit and a third signal to generate an output signal responsive to the first signal and the third signal, a check circuit configured to generates a check signal indicative of an operating condition of the operation test circuit in response to the output signal of the operation test circuit, and an adjustment circuit configured to adjust the signal generating circuit in response to the check signal output from the check circuit.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

In the following, embodiments will be described with reference to the accompanying drawings.

Figure 2:
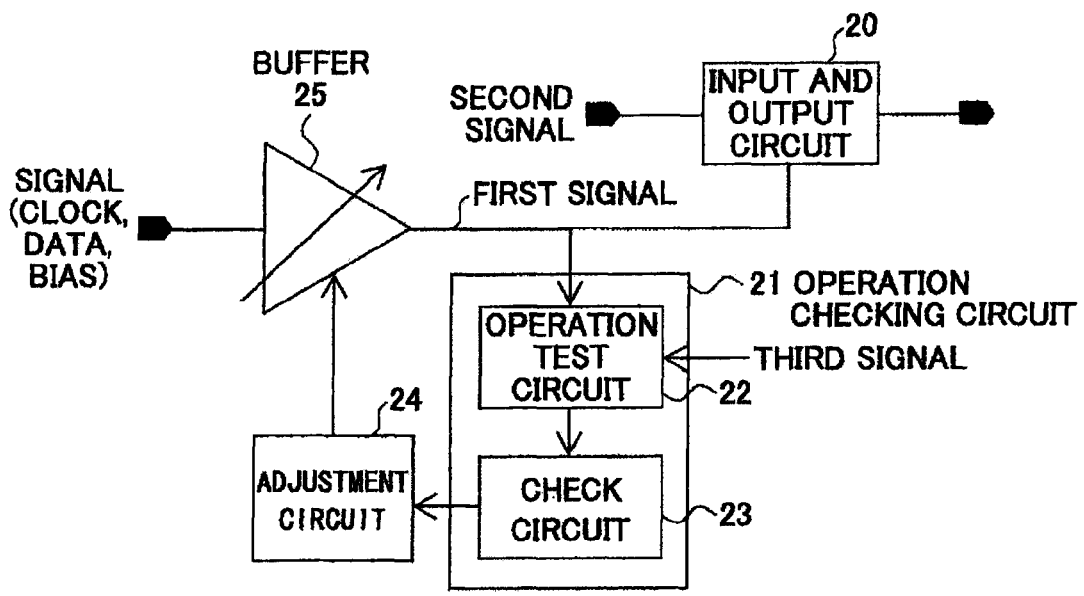
FIG. 2 is a drawing showing the basic configuration of an input and output circuit apparatus.

FIG. 2 is a drawing showing the basic configuration of an input and output circuit apparatus. An input and output circuit apparatus of FIG. 2 includes an input and output circuit 20, an operation checking circuit 21, an adjustment circuit 24, and a buffer 25. The operation checking circuit 21 includes an operation test circuit 22 and a check circuit 23.

In the input and output circuit apparatus of FIG. 2, the buffer (i.e., signal generating circuit) 25 receives a clock, data, or bias signal, and buffers the received signal to generate a clock, data, or bias signal. The signal that is generated by and output from the buffer 25 is referred to as a first signal for the sake of convenience of explanation. The input and output circuit 20 receives the first signal from the buffer 25 and a second signal to generate an output signal responsive to the first signal and the second signal. The operation test circuit 22 has substantially the same circuit configuration as the input and output circuit 20, and receives the first signal from the buffer 25 and a third signal to generate an output signal responsive to the first signal and the third signal. The check circuit 23 generates, in response to the output signal of the operation test circuit 22, a check signal indicative of whether the operation test circuit 22 is properly operating. The adjustment circuit 24 adjusts the first signal by controlling the buffer 25 in response to the check signal supplied from the check circuit 23.

Figure 1:
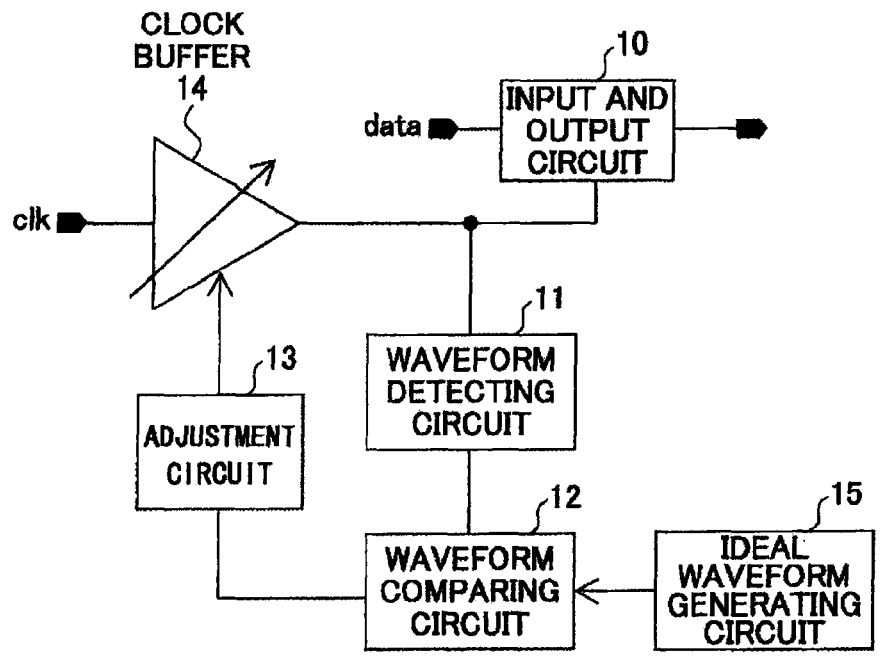
FIG. 1 is a drawing illustrating an example of the configuration of a related-art circuit for adjusting to an optimum value the center voltage of a clock signal input into an input and output circuit.

In the related-art configuration illustrated in FIG. 1, a check is made as to whether the signal generated by the clock buffer 14 has a desired waveform, and the adjustment circuit 13 adjusts the clock buffer 14 based on the outcome of this check. In the configuration of the embodiment illustrated in FIG. 2, a check is made as to whether the operation test circuit 22 having substantially the same circuit configuration as the input and output circuit 20 is properly operating, and the adjustment circuit 24 adjusts the buffer 25 based on the outcome of this check. Manufacturing variation affects the input and output circuit 20 and the operation test circuit 22 in similar manners. If the first signal is adjusted to a proper value to secure a proper operation of the operation test circuit 22, then, a proper operation of the input and output circuit 20 is also guaranteed even with the presence of manufacturing variation.

The operation test circuit 22 may have the same circuit configuration as the input and output circuit 20 with only differences in the sizes of circuit elements, or may be the same circuit as the input and output circuit 20 in terms of both the configuration and the size. The third signal supplied to the operation test circuit 22 suffices if the output of the operation test circuit 22 can be estimated. The third signal may be the same as the second signal, for example, or may be a more simplified signal (e.g., a signal exhibiting dynamic changes or a fixed pattern signal) The output of the operation test circuit 22 may be a signal that exhibits a change within a predetermined period.

Figure 3:
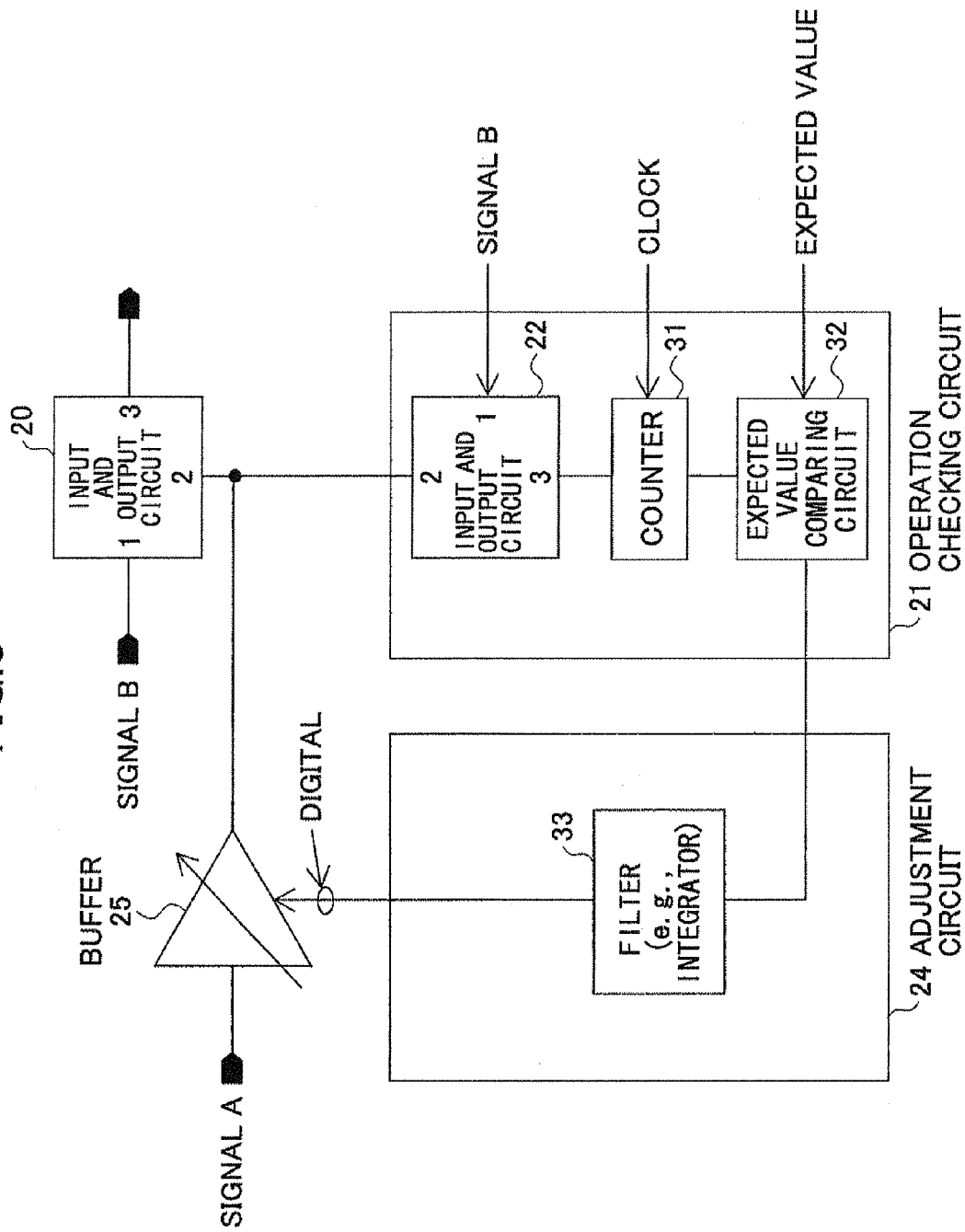
FIG. 3 is a drawing illustrating the configuration of a first embodiment of the input and output circuit apparatus.

FIG. 3 is a drawing illustrating the configuration of a first embodiment of the input and output circuit apparatus. In FIG. 3, the same elements as those of FIG. 2 are referred to by the same numerals, and a description thereof will be omitted.

An input and output circuit apparatus of FIG. 3 includes an input and output circuit 20, an operation checking circuit 21, an adjustment circuit 24, and a buffer 25. The operation checking circuit 21 includes an input and output circuit (i.e., operation test circuit) 22, a counter 31, and an expected value comparing circuit 32. The input and output circuit 22 is referred to as an "input and output circuit" using the same name as the input and output circuit 20 in order to indicate that the input and output circuit 22 has substantially the same configuration as the input and output circuit 20. The counter 31 and the expected value comparing circuit 32 correspond to the check circuit 23 illustrated in FIG. 2.

Numbers 1, 2, and 3 indicated in each block of the input and output circuit 20 and the input and output circuit 22 refer to their input and output terminals. The input terminal 1 of the input and output circuit 20 receives a signal B, the input terminal 2 thereof receiving the output signal of the buffer 25, and the output terminal 3 thereof transmitting the output signal. Similarly, the input terminal 1 of the input and output circuit 22 receives the signal B (or simplified signal), the input terminal 2 thereof receiving the output signal of the buffer 25, and the output terminal 3 thereof transmitting the output signal.

The counter 31 counts the number of signal level transitions in the output signal of the input and output circuit 22. The counter 31 measures a passage of time by use of a clock signal having a known frequency, and supplies to the expected value comparing circuit 32 a count value indicative of the number of signal level transitions in the output of the input and output circuit 22 that occur within a predetermined time period. The expected value comparing circuit 32 compares the count value supplied from the counter 31 with an expected count value, and supplies a difference between these to the adjustment circuit 24.

The adjustment circuit 24 includes a filter 33. The filter 33 serves as an integrator. The filter 33 integrates (i.e., smoothes) the output of the expected value comparing circuit 32 over a long time to prevent an unnecessary adjustment operation from being performed in response to noise components. The adjustment circuit 24 adjusts the output signal of the buffer 25 by controlling the buffer 25 through the digital value output from the filter 33. Through this feedback control, adjustment is made such that the output (i.e., difference between the count values) of the expected value comparing circuit 32 becomes zero. When the output of the expected value comparing circuit 32 becomes equal to zero through such an adjustment, the number of signal level transitions in the output signal of the input and output circuit 22 within the predetermined period is equal to the number of expected transitions. This condition is used as a criterion to determine that the state in which the input and output circuit 22 is properly operating is ensured.

Figure 4:
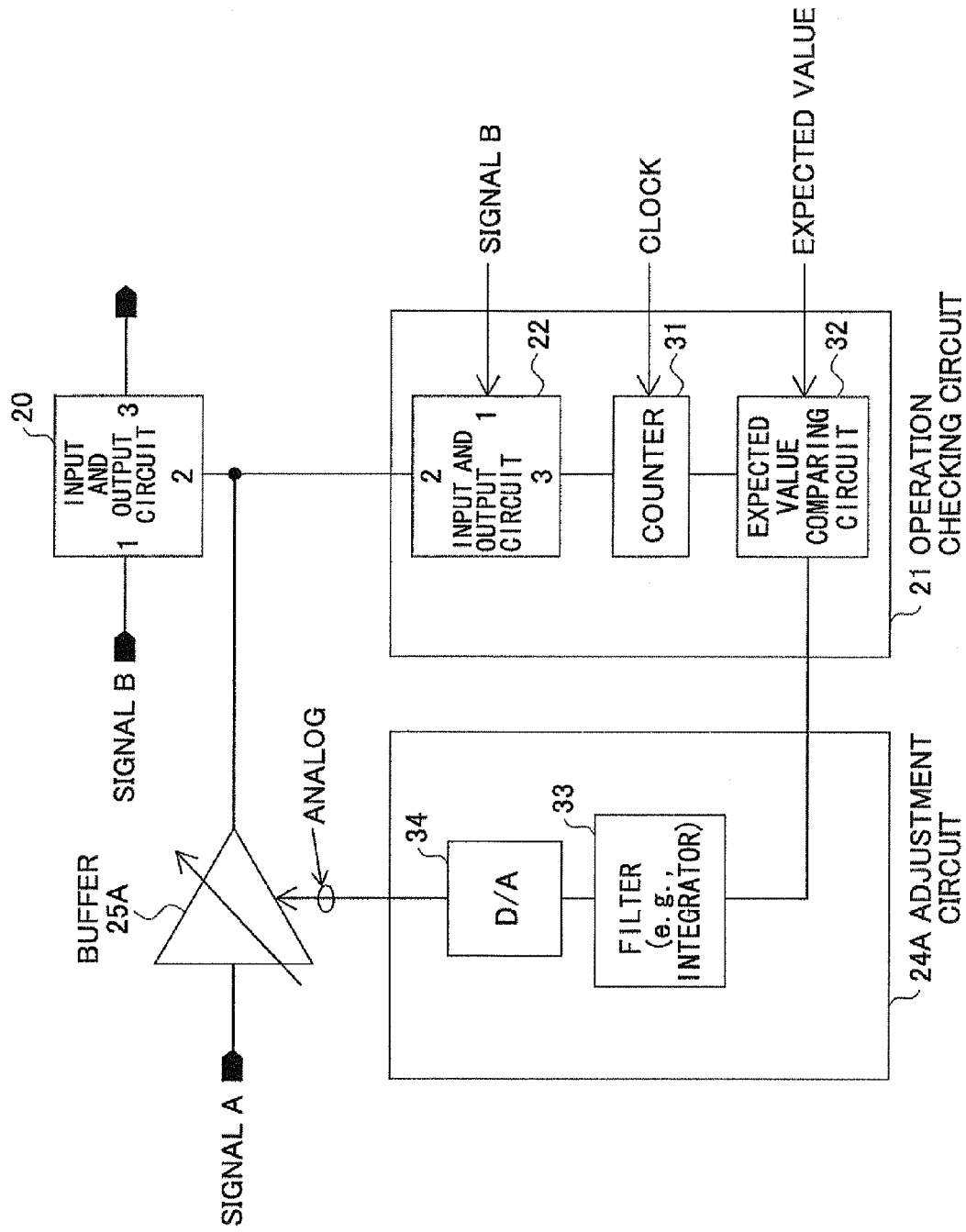
FIG. 4 is a drawing illustrating the configuration of a second embodiment of the input and output circuit apparatus.

FIG. 4 is a drawing illustrating the configuration of a second embodiment of the input and output circuit apparatus. In FIG. 4, the same elements as those of FIG. 3 are referred to by the same numerals, and a description thereof will be omitted.

The input and output circuit apparatus of FIG. 4 differs from the input and output circuit apparatus of FIG. 3 in that an the adjustment circuit 24A is provided in place of the adjustment circuit 24, and in that a buffer 25A is provided in place of the buffer 25. The adjustment circuit 24A differs from the adjustment circuit 24 in that a D/A converter 34 is provided in addition to the filter 33. The buffer 25A differs from the buffer 25 in that the buffer 25A is controlled by an analog value. The D/A converter 34 converts the digital value output from the filter 33 into an analog value. The adjustment circuit 24A adjusts the output signal of the buffer 25A by controlling the buffer 25A through the analog value output from the D/A converter 34. The remaining operations are the same as those of the configuration illustrated in FIG. 3.

Figure 5:
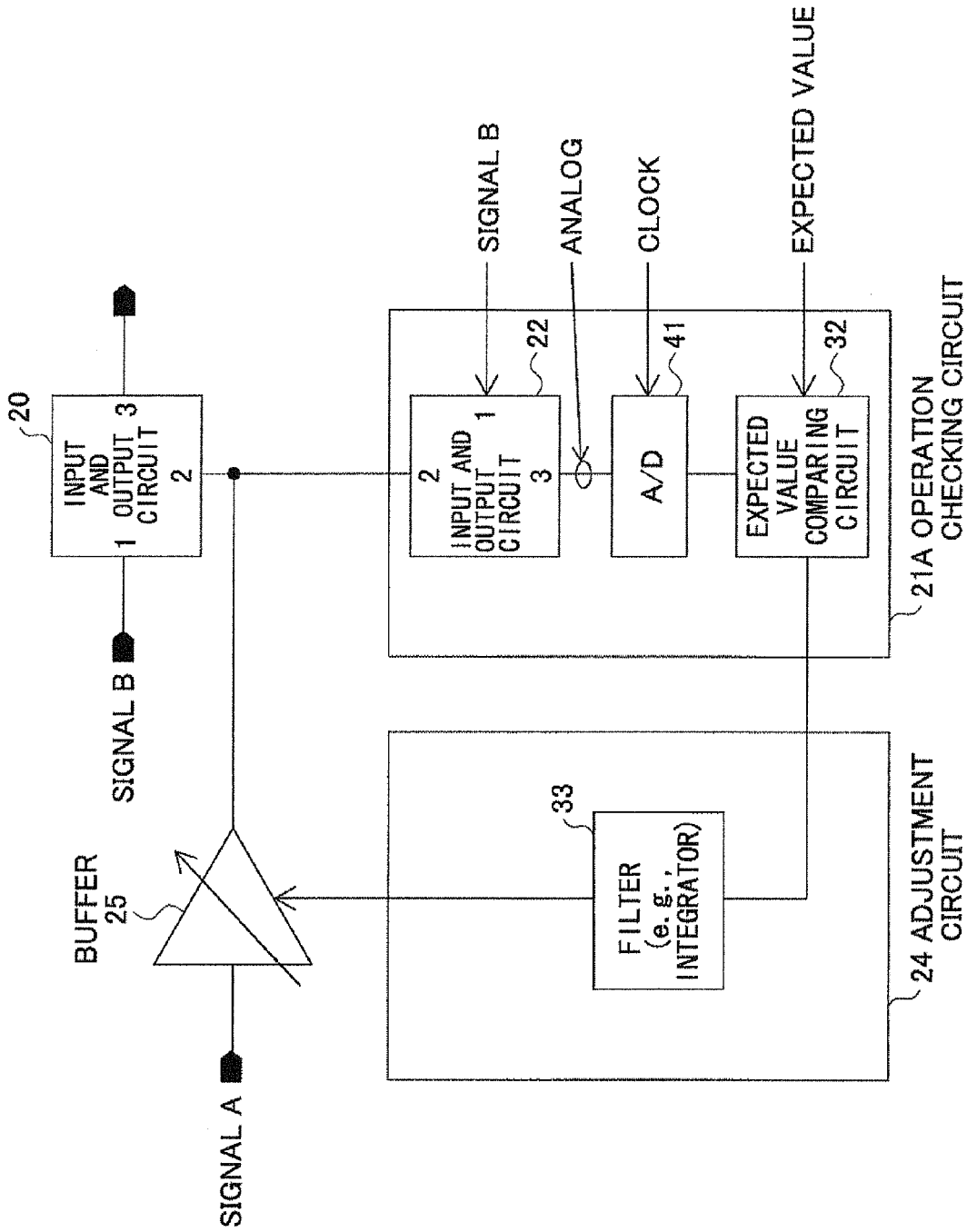
FIG. 5 is a drawing illustrating the configuration of a third embodiment of the input and output circuit apparatus.

FIG. 5 is a drawing illustrating the configuration of a third embodiment of the input and output circuit apparatus. In FIG. 5, the same elements as those of FIG. 3 are referred to by the same numerals, and a description thereof will be omitted.

The input and output circuit apparatus of FIG. 5 differs from the input and output circuit apparatus of FIG. 3 in that an operation checking circuit 21A is provided in place of the operation checking circuit 21. The operation checking circuit 21A differs from the operation checking circuit 21 in that an A/D converter 41 is provided in place of the filter 31. In the operation checking circuit 21A, the output of the input and output circuit 22 is an analog signal. The A/D converter 41 performs A/D conversion with respect to the analog signal output from the input and output circuit 22, and supplies a digital signal obtained through the A/D conversion to the expected value comparing circuit 32. The expected value comparing circuit 32 compares the digital value supplied from the A/D converter 41 with an expected count value, and supplies a difference between these to the adjustment circuit 24. The remaining operations are the same as those of the configuration illustrated in FIG. 3.

Figure 6:
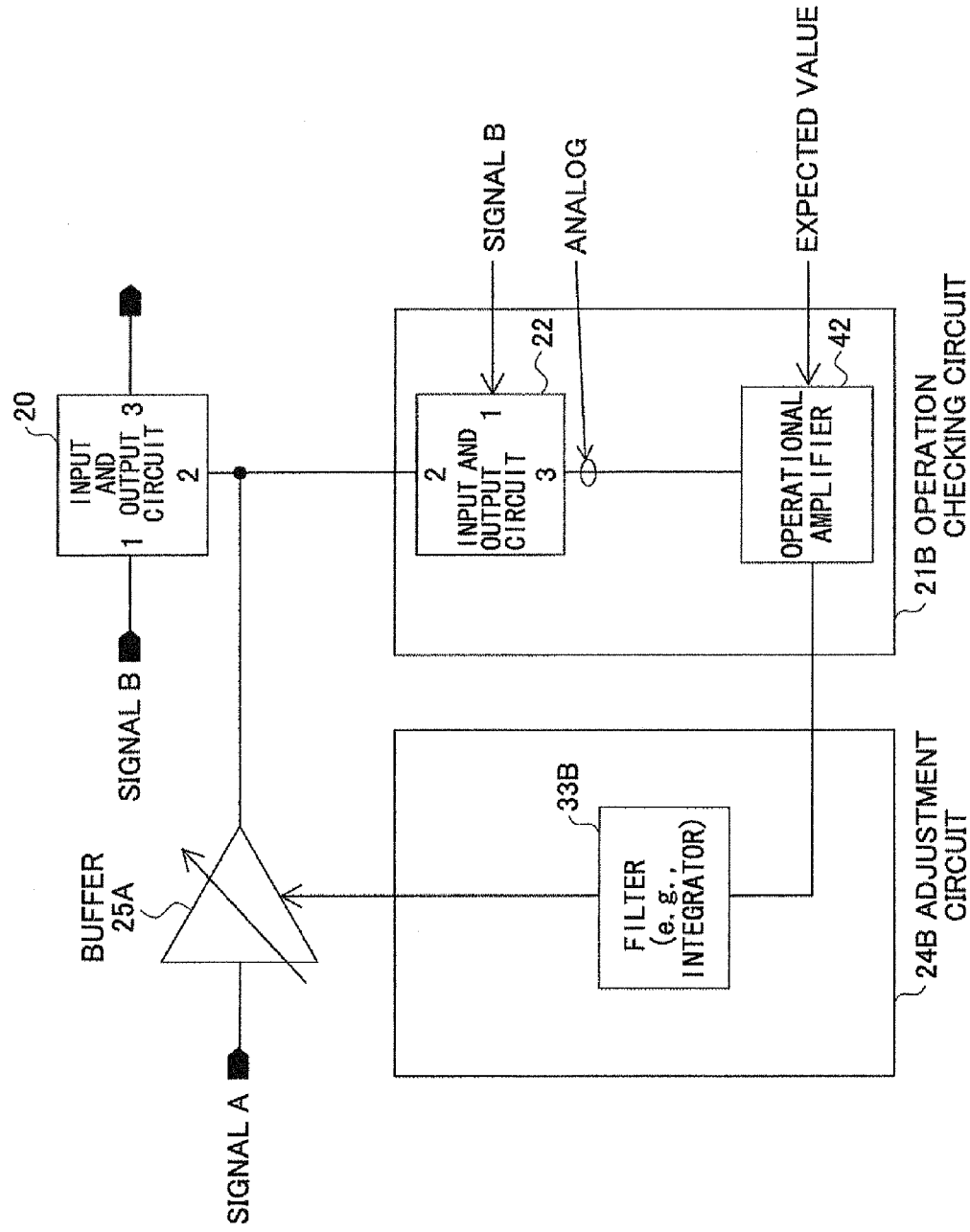
FIG. 6 is a drawing illustrating the configuration of a fourth embodiment of the input and output circuit apparatus.

FIG. 6 is a drawing illustrating the configuration of a fourth embodiment of the input and output circuit apparatus. In FIG. 6, the same elements as those of FIGS. 3 through 5 are referred to by the same numerals, and a description thereof will be omitted.

In an operation checking circuit 21B illustrated in FIG. 6, the output of the input and output circuit 22 is an analog signal. An operational amplifier 42 compares the analog output signal of the input and output circuit 22 with an expected value analog signal, and supplies a current output responsive to the difference to a filter 33B. The filter 33B integrates the current output of the operational amplifier 42 to supply the result of integration to the buffer 25A as an analog signal. An adjustment circuit 24B adjusts the output signal of the buffer 25A by controlling the buffer 25A through the analog value output from the filter 33B. The remaining operations are the same as those of the configurations illustrated in FIG. 3 through FIG. 5.

Figure 7:
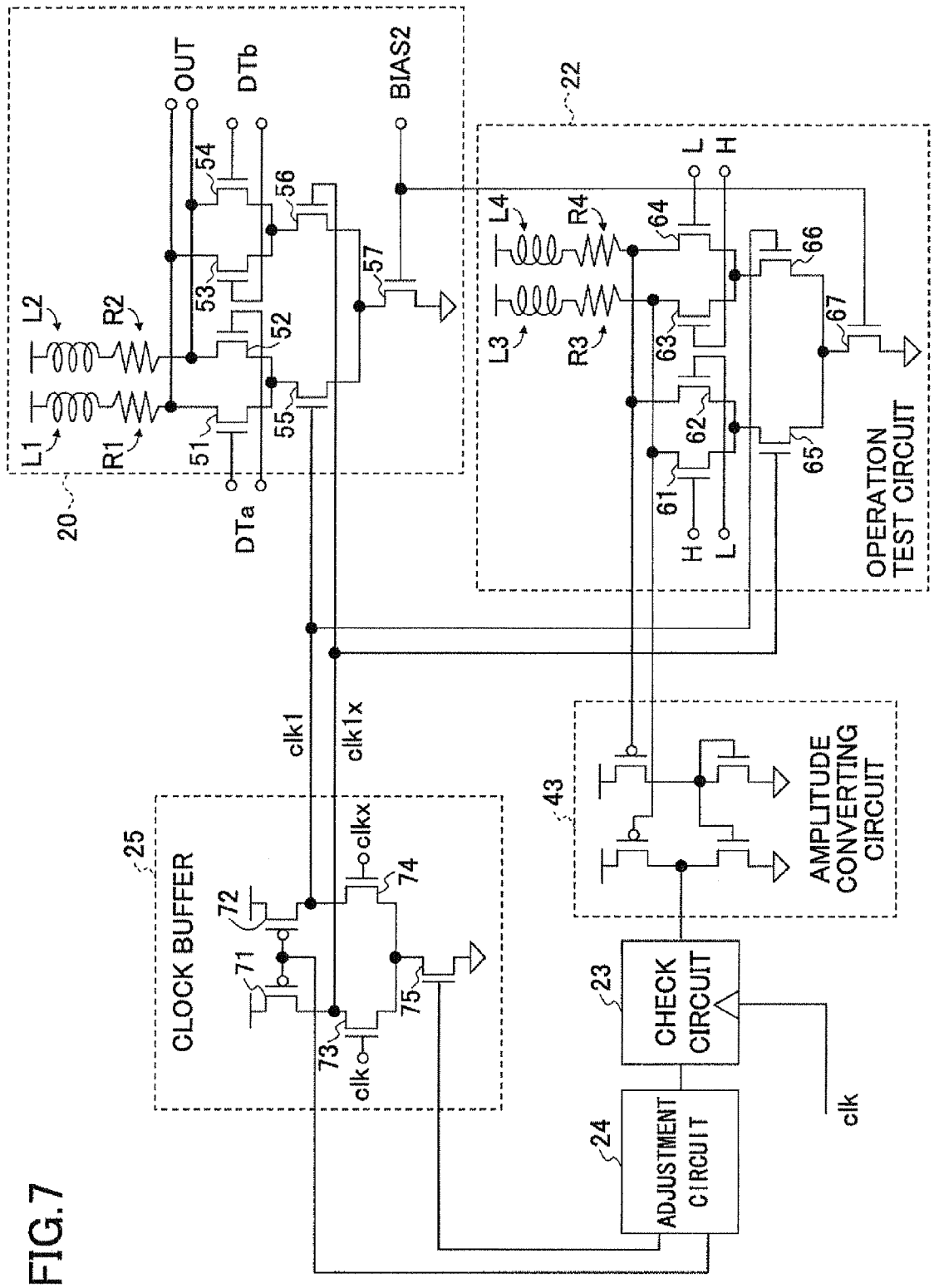
FIG. 7 is a drawing illustrating the configuration of a fifth embodiment of the input and output circuit apparatus.

FIG. 7 is a drawing illustrating the configuration of a fifth embodiment of the input and output circuit apparatus. An input and output circuit apparatus of FIG. 7 includes the input and output circuit 20, the operation test circuit 22, the check circuit 23, the adjustment circuit 24, the buffer 25, and an amplitude converting circuit 43.

The input and output circuit 20 includes transistors 51 through 57, resistors R1 and R2, and inductors L1 and L2. In response to a clock signal clk1 and an inverted clock signal clk1x, data signals DTa and DTb are multiplexed at a ratio of 2 to 1 to be output as an output signal OUT. The amount of drive current of the input and output circuit 20 is controlled by BIAS2.

The operation test circuit 22 has the same circuit configuration as the input and output circuit 20, and includes transistors 61 through 67, resistors R3 and R4, and inductors L3 and L4. In response to the clock signal clk1 and the inverted clock signal clk1x, data signals fixed to HIGH and LOW and data signals fixed to LOW and HIGH are multiplexed at a ratio of 2 to 1 to generate an output signal. This output signal alternates between HIGH and LOW in synchronization with the clock signals.

The buffer 25 includes PMOS transistors 71 and 72 and NMOS transistors 73 through 75. A clock signal clk and an inverted clock signal clkx are applied as input signals to the gates of the NMOS transistors 73 and 74, respectively, so that the clock signal clk1 and the inverted clock signal clk1x are obtained as output signals. The control nodes (i.e., gate nodes) of the PMOS transistors 71 and 72 and NMOS transistor 75 receive signals supplied from the adjustment circuit 24. The signal voltage applied to the gate nodes of the PMOS transistors 71 and 72 is controlled to change the ON resistance of the PMOS transistors 71 and 72, thereby adjusting the amplitude of the clock signal clk1 and inverted clock signal clk1x. Further, the signal voltage applied to the gate node of the NMOS transistor 75 is controlled to change the amount of current flowing through the NMOS transistor 75, thereby adjusting the center voltage of the clock signal clk1 and inverted clock signal clk1x.

In the case of a proper operation, the operation test circuit 22 outputs a pattern "HLHLHL . . . " that alternates between HIGH and LOW. The amplitude of this signal is small. In the present embodiment, thus, the amplitude converting circuit 43 amplifies the signal amplitude for provision to the check circuit 23. The check circuit 23 checks whether the received pattern alternating between HIGH and LOW matches the expected pattern. The result of the check is supplied to the adjustment circuit 24. In response to this check result, the adjustment circuit 24 controls the voltages applied to the gate nodes of the PMOS transistors 71 and 72 and NMOS transistor 75 provided in the buffer 25. With this arrangement, the center voltage and amplitude of the clock signal clk1 and inverted clock signal clk1x are subjected to feedback control. The feedback control is stopped once the operation test circuit 22 starts operating properly.

Figure 8:
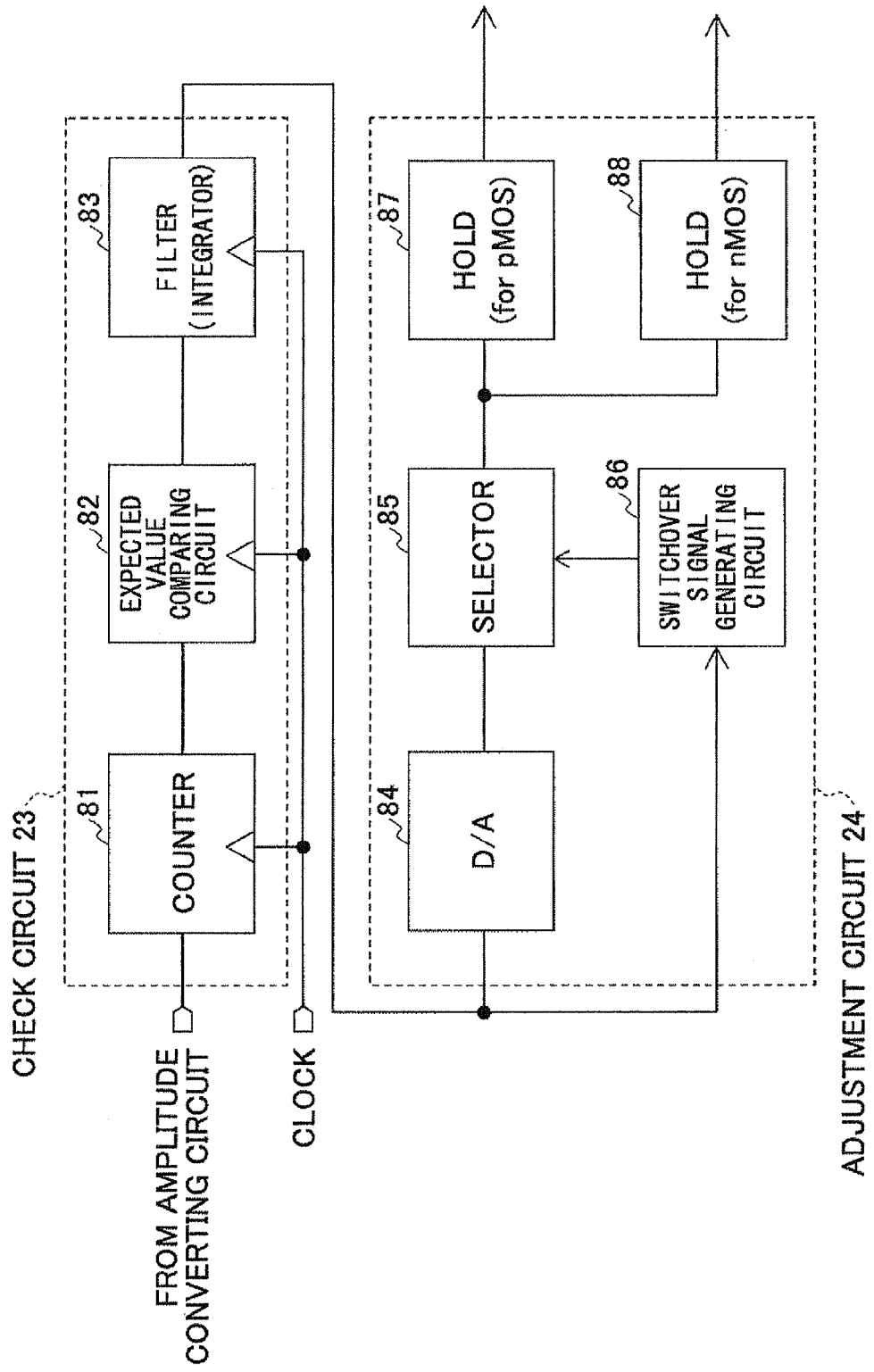
FIG. 8 is a drawing illustrating an example of the configuration of a check circuit and an adjustment circuit illustrated in FIG. 7.

FIG. 8 is a drawing illustrating an example of the configuration of the check circuit 23 and the adjustment circuit 24 illustrated in FIG. 7. In FIG. 8, the check circuit 23 includes a counter 81, an expected value comparing circuit 82, a filter (i.e., integrator) 83, a D/A converter 84, a selector 85, a switchover signal generating circuit 86, a hold circuit 87, and a hold circuit 88.

The counter 81 counts the number of signal level transitions in the output signal of the amplitude converting circuit 43 (see FIG. 7). The counter 81 measures a passage of time by use of a clock signal having a known frequency, and supplies to the expected value comparing circuit 82 a count value indicative of the number of signal level transitions in the output of the amplitude converting circuit 43 that occur within a predetermined time period. The expected value comparing circuit 82 compares the count value supplied from the counter 81 with an expected count value at predetermined timing indicated by the clock signals, and supplies a difference between these to the filter 83.

The filter 83 serves as an integrator. The filter 33 integrates (i.e., smoothes) the output of the expected value comparing circuit 82 over a long time to prevent an unnecessary adjustment operation from being performed in response to noise components. The output of the filter 83 that is obtained by integrating the differences between the expected value and actual values is supplied to the D/A converter 84 and switchover signal generating circuit 86 of the adjustment circuit 24. The D/A converter 84 performs a digital-to-analog conversion with respect to the output of the filter 83 to supply the converted result to the selector 85. The selector 85 makes an output voltage setting with respect to the hold circuit 87 or the hold circuit 88 in response to the converted result supplied from the D/A converter 84. Which one of the hold circuits is selected for an output voltage setting made by the selector 85 is determined by the switchover signal generating circuit 86. The switchover signal generating circuit 86 controls the selector 85 to select the hold circuit 87 for an output voltage setting to be made in response to the output of the filter 83 exceeding a predetermined threshold value, and controls the selector 85 to select the hold circuit 88 for an output voltage setting to be made in response to the output of the filter 83 falling below the predetermined threshold value. The output voltage of the hold circuit 87 is applied to the gates of the PMOS transistors 71 and 72 provided in the buffer 25, and the output voltage of the hold circuit 88 is applied to the gate of the NMOS transistor 75 of the buffer 25.

Through the above-described operation, the gate voltages of the PMOS transistors 71 and 72 are controlled to adjust the amplitude of the clock signal clk1 and inverted clock signal clk1x, thereby reducing the output of the filter 83 that indicates an integrated value of differences between the expected value and actual values. When the output of the filter 83 becomes sufficiently small to fall below the threshold value, the adjustment of the center voltage is started upon recognition that the adjustment of amplitude is satisfactorily completed. Namely, the gate voltage of the NMOS transistor 75 is controlled to adjust the center voltage of the clock signal clk1 and inverted clock signal clk1x, thereby reducing the output of the filter 83 that indicates an integrated value of differences between the expected value and actual values.

Through this feedback control, adjustment is made such that the output (i.e., difference between the count values) of the expected value comparing circuit 82 becomes zero. When the output of the expected value comparing circuit 82 becomes sufficiently small through such an adjustment, the number of signal level transitions in the output signal of the operation test circuit 22 within a predetermined period is substantially equal to the number of expected transitions. This condition is used as a criterion to determine that the state in which the operation test circuit 22 is properly operating is ensured.

Figure 9:
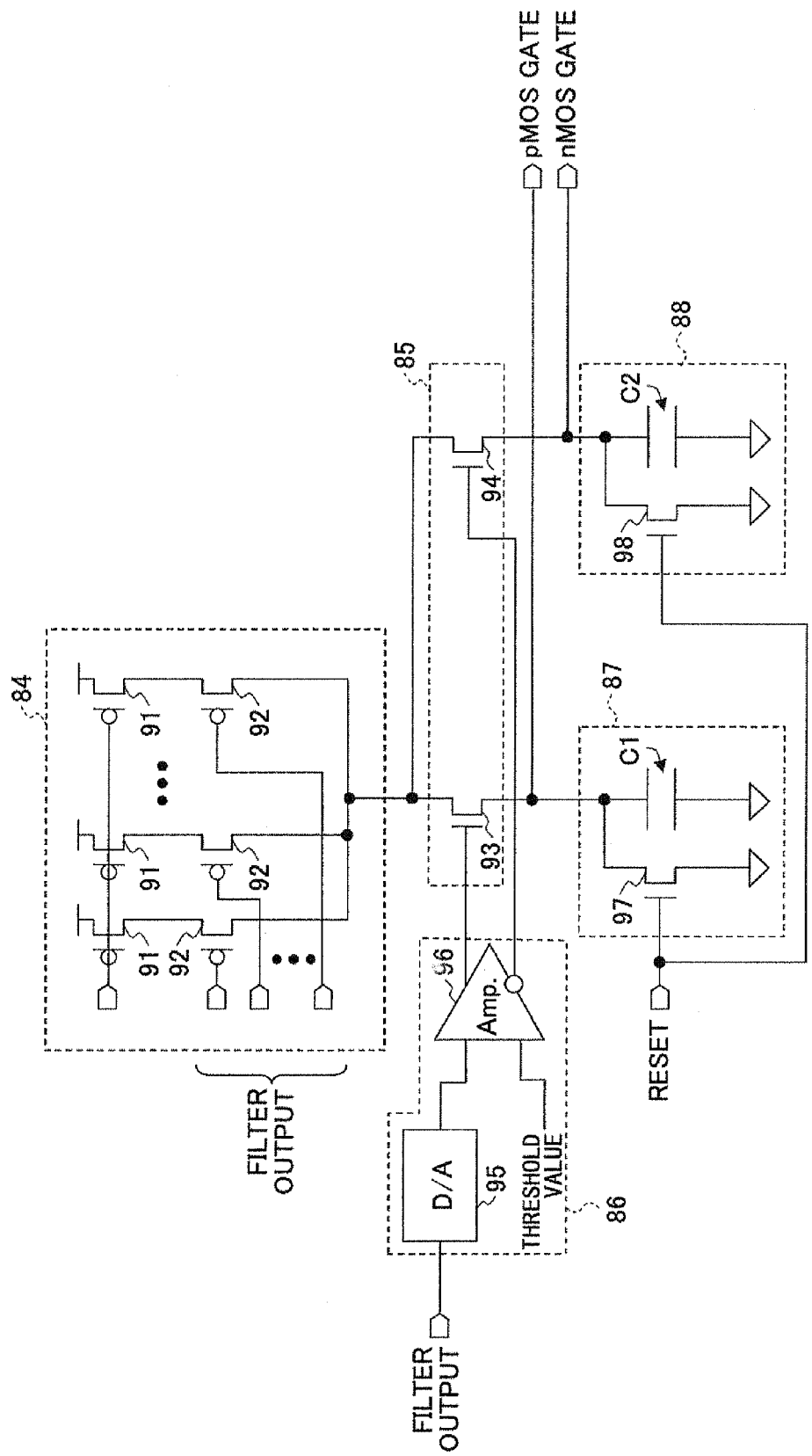
FIG. 9 is a drawing illustrating an example of the circuit configuration of the adjustment circuit illustrated in FIG. 8.

FIG. 9 is a drawing illustrating an example of the circuit configuration of the adjustment circuit 24 illustrated in FIG. 8. In the adjustment circuit 24 illustrated in FIG. 9, the D/A converter 84 includes a plurality of PMOS transistors 91 and a plurality of PMOS transistors 92. The selector 85 includes NMOS transistors 93 and 94. The switchover signal generating circuit 86 includes a D/A converter 95 and a differential amplifier 96. The hold circuit 87 includes an NMOS transistor 97 and a capacitor C1. The hold circuit 88 includes an NMOS transistor 98 and a capacitor C2.

The switchover signal generating circuit 86 uses the D/A converter 95 to perform D/A conversion with respect to the output of the filter 83, and uses the differential amplifier 96 to compare the D/A converted result with a threshold value. If the D/A-converted result is larger than the threshold value, the NMOS transistor 93 of the selector 85 is made conductive, for example. Conversely, if the D/A-converted result is smaller than the threshold value, the NMOS transistor 94 of the selector 85 is made conductive.

Upon having a conductive state in the NMOS transistor 93 or 94, a current supplied from the PMOS transistors 91 of the D/A converter 84 flows into the corresponding capacitor C1 or C2. The amount of this flowing current is dependent on the number of transistors that are conductive among the PMOS transistors 92. The outputs of the filter 83 are applied to the control nodes (i.e., gate nodes) of the PMOS transistors 92. Which PMOS transistors 92 are made conductive thus depends on the outputs of the filter 83. In this manner, the amount of electric charge accumulated in the capacitor C1 or C2 is determined in response to an integrated value of differences between the expected value and actually measured values. Through this operation, the output voltages of the hold circuits 87 and 88 are adjusted. If the outputs of the filter 83 that indicate an error represent a large value, an increased amount of current may be made to flow into the capacitor C1 or C2, for example. If the error becomes small so that the outputs of the filter 83 represent a smaller value, a decreased mount of current may be made to flow into the capacitor C1 or C2.

In the hold circuits 87 and 88, the NMOS transistors 97 and 98 are provided for the reset purposes, respectively. Applying HIGH to the reset node to make the NMOS transistors 97 and 98 conductive serves to discharge the capacitor C1 and C2, respectively. With this arrangement, it is possible to achieve a state in which no electric charge is accumulated (i.e., the state in which the output voltage is zero).

Figure 10:
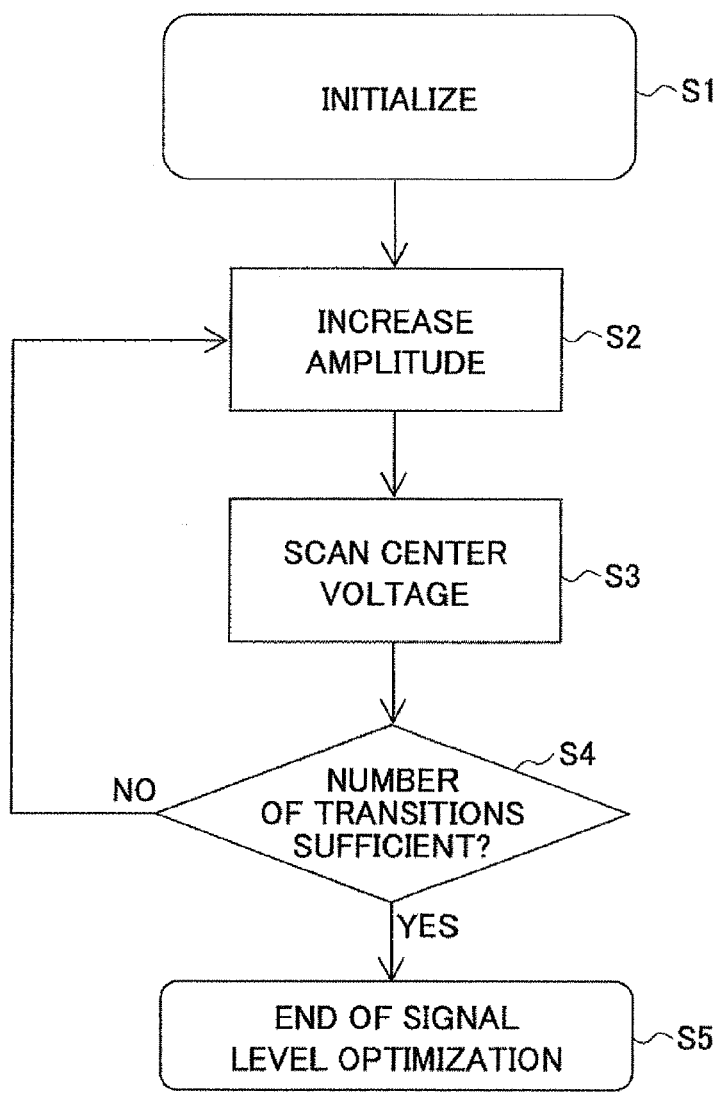
FIG. 10 is a flowchart illustrating the optimization of signal levels in the input and output circuit apparatus illustrated in FIG. 7 through FIG. 9.

FIG. 10 is a flowchart illustrating the optimization of signal levels in the input and output circuit apparatus illustrated in FIG. 7 through FIG. 9. In step S1, initialization is performed. Through this initialization, the amplitude of the clock signals clk1 and clk1x is set to zero, and the center voltage thereof is set to its minimum value. This is achieved by applying a HIGH signal to the reset node in FIG. 9, for example.

In step S2, the amplitude of the clock signals clk1 and clk1x is gradually increased. This corresponds to gradually increasing the output voltage of the hold circuit 87 in FIG. 9, for example. Once the amplitude of the clock signals clk1 and clk1x is increased to provide a sufficiently small error (i.e., the output of the filter 83), the center voltage is scanned in step S3. Namely, the center voltage of the clock signals clk1 and clk1x is gradually increased. This corresponds to gradually increasing the output voltage of the hold circuit 88 in FIG. 9, for example.

In step S4, a check is made as to whether the number of transitions is sufficient. Namely, a check is made as to whether the number of signal level transitions occurring in the output signal of the operation test circuit 22 of FIG. 7 within a predetermined period is equal to the expected number. This check is made by the check circuit 23. If the number of actual transitions is not equal to the expected number of transitions, the amplitude and central voltage are adjusted again. When the number of actual transitions is equal to the expected number of transitions, the procedure goes to step S5. With this, the optimization of signal levels comes to an end.

Figure 11:
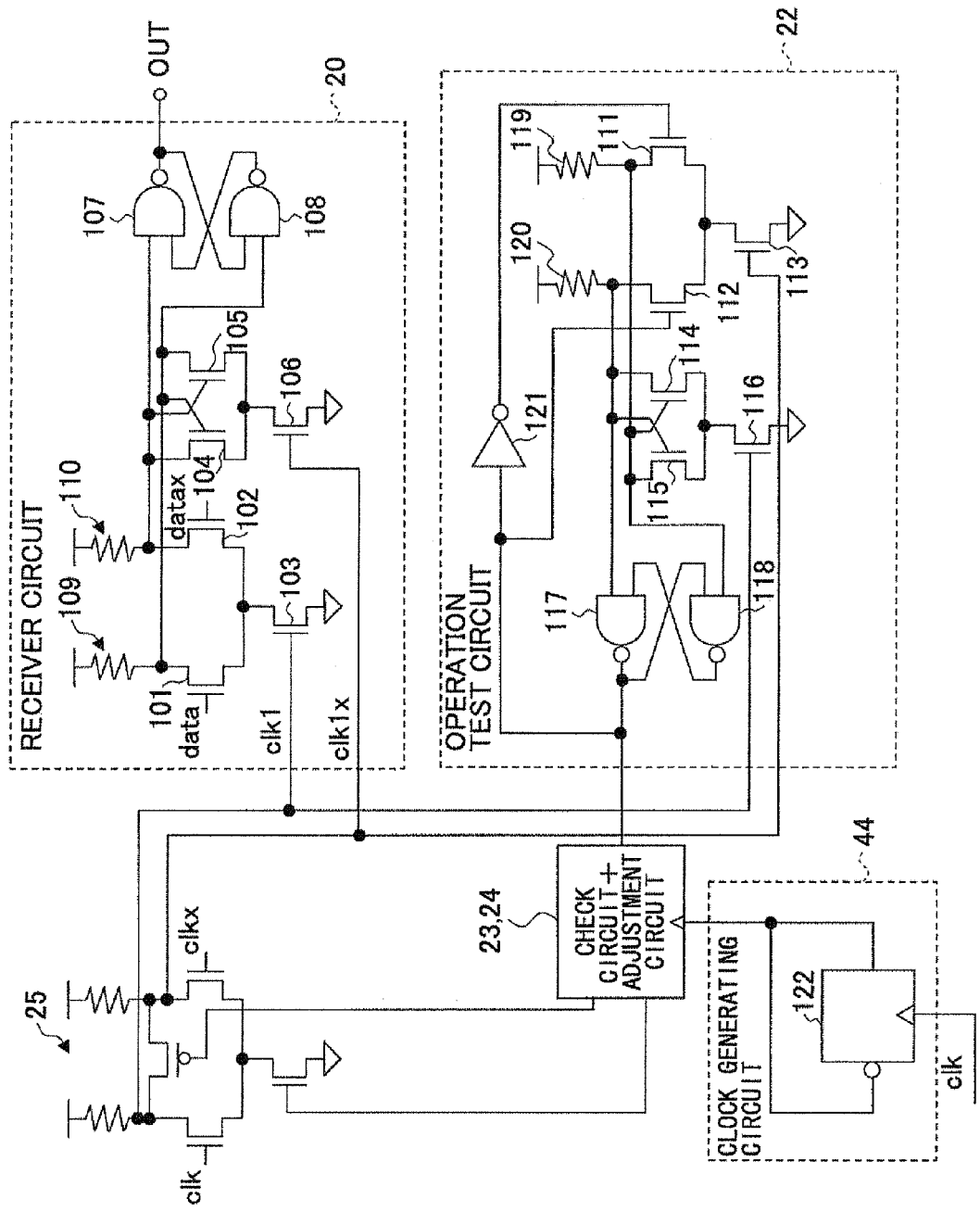
FIG. 11 is a drawing illustrating the configuration of a sixth embodiment of the input and output circuit apparatus.

FIG. 11 is a drawing illustrating the configuration of a sixth embodiment of the input and output circuit apparatus. An input and output circuit apparatus of FIG. 11 includes the input and output circuit 20, the operation test circuit 22, the check circuit 23, the adjustment circuit 24, the buffer 25, and a clock generating circuit 44. For the sake of convenience, the check circuit 23 and adjustment circuit 24 are combined together and illustrated as a single circuit.

The input and output circuit 20 includes transistors 101 through 106, NAND gates 107 and 108, and resistors 109 and 110. In response to the clock signal clk1 and the inverted clock signal clk1x, data signals data and datax are received and latched in the latch comprised of the NAND gates 107 and 108.

The operation test circuit 22 has the same circuit configuration as the input and output circuit 20, and includes transistors 111 through 116, NAND gates 117 and 118, resistors 119 and 120, and an inverter 121. In response to the clock signal clk1 and the inverted clock signal clk1x, data that is inverse to the previous output data is received as the current input data, and is latched in the latch comprised of the NAND gates 117 and 118. This output signal alternates between HIGH and LOW in synchronization with the clock signals.

The size of each circuit element of the operation test circuit 22 is smaller than the size of the corresponding circuit element of the input and output circuit 20. This prevents the operation test circuit 22 coupled to the clock nodes from increasing the load capacitance to induce band degradation. The output of the operation test circuit 22 is a signal having large amplitude in the present embodiment, and is directly supplied to the check circuit 23. In order to generate inputs into the operation test circuit 22, a flip-flop may be provided in place of the inverter 121, so that the 1-to-2 frequency division circuit may be converted into a 1-to-4 frequency division circuit.

The check circuit 23 receives a clock signal generated by the clock generating circuit 44. The clock generating circuit 44 receives the clock signal clk that is the same as the clock signal supplied to the buffer 25, and performs a ½ frequency division to generate a clock signal for provision to the check circuit 23.

Remaining configurations and operations are the same as those of the fifth embodiment, and a description thereof is omitted.

Figure 12:
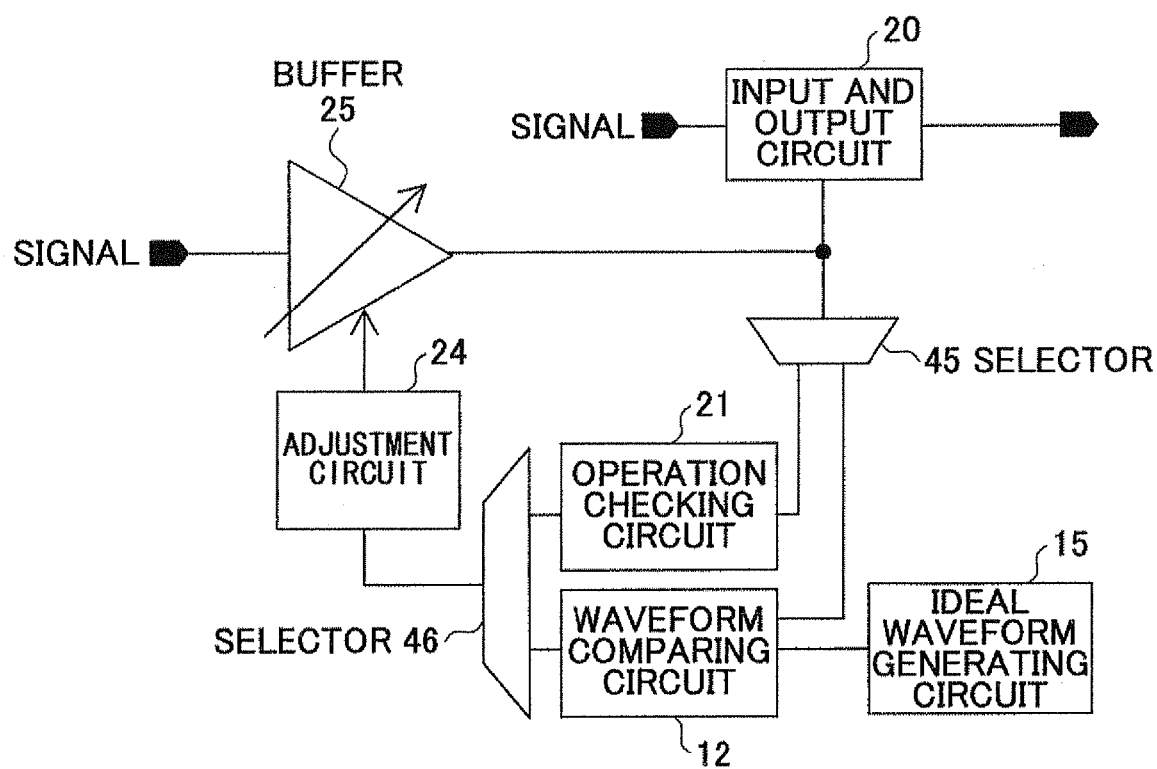
FIG. 12 is a drawing illustrating the configuration of a seventh embodiment of the input and output circuit apparatus.

FIG. 12 is a drawing illustrating the configuration of a seventh embodiment of the input and output circuit apparatus. In FIG. 12, the same elements as those of FIG. 1 and FIG. 2 are referred to by the same numerals, and a description thereof will be omitted.

An input and output circuit apparatus of FIG. 12 includes the waveform comparing circuit 12, the ideal waveform generating circuit 15, the input and output circuit 20, the operation checking circuit 21, the adjustment circuit 24, the buffer 25, a selector 45, and a selector 46. The configuration illustrated in FIG. 12 is provided with the operation checking circuit 21 operating according to the description illustrated in FIG. 2, and is also provided with the waveform comparing circuit 12 and ideal waveform generating circuit 15 of the related-art configuration illustrated in FIG. 1. Either of these is used to adjust the buffer 25. Which configuration to use is selected by the selectors 45 and 46.

The signal adjustment function provided by the waveform comparing circuit 12 and ideal waveform generating circuit 15 is used to make a coarse setting to signals at the time of commencement of the operation. Switching by the selectors 45 and 46 is then performed upon a passage of a predetermined time from the commencement of the operation, so that the signal adjustment function of the operation checking circuit 21 will thereafter be used. With this arrangement, it is possible to shorten a time length that is required for signal adjustment.

Figure 13:
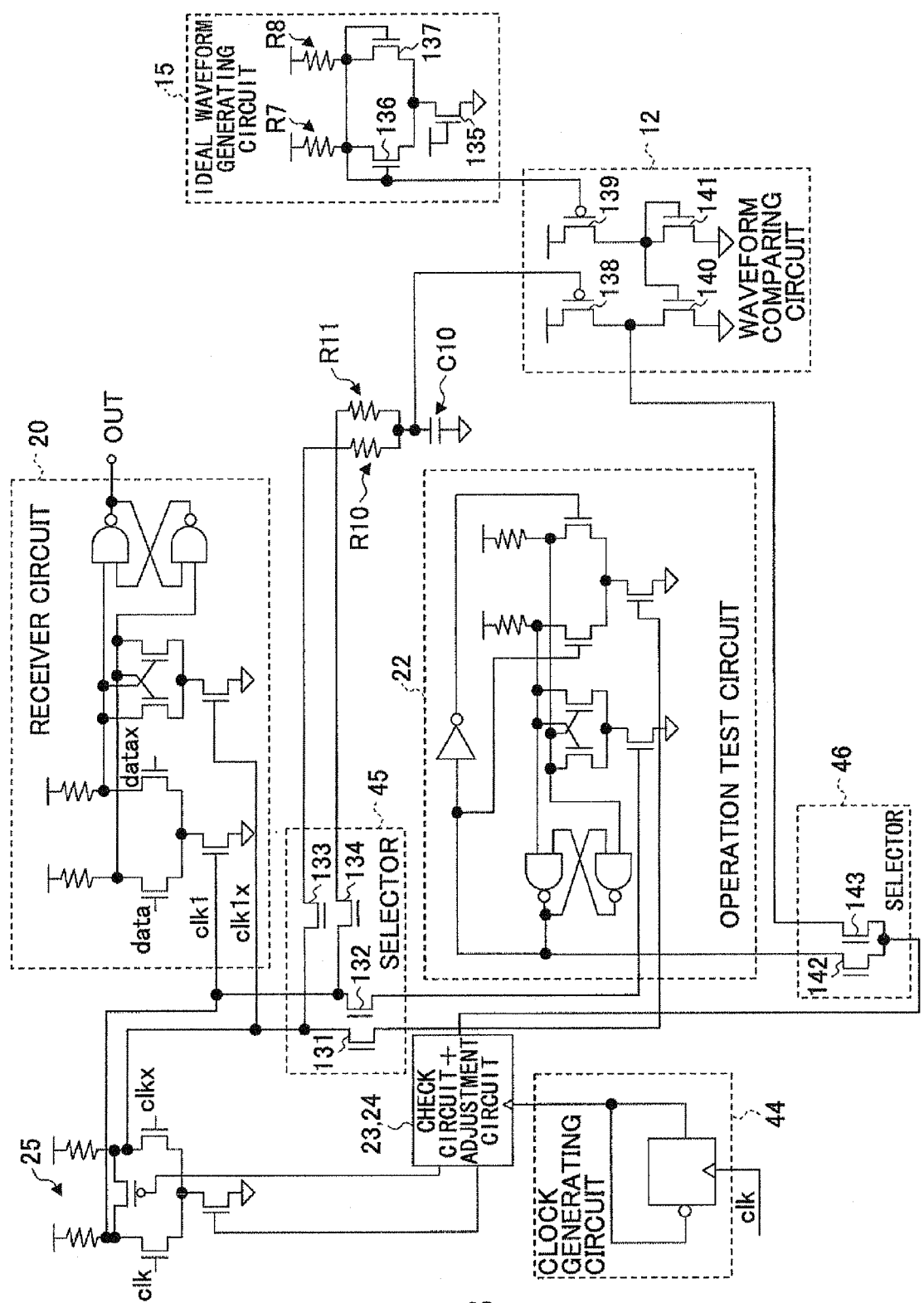
FIG. 13 is a drawing illustrating an example of a specific circuit configuration of the input and output circuit apparatus of FIG. 12.

FIG. 13 is a drawing illustrating an example of a specific circuit configuration of the input and output circuit apparatus of FIG. 12. In the input and output circuit apparatus illustrated in FIG. 13, the input and output circuit 20, the operation test circuit 22, the check circuit 23, the adjustment circuit 24, the buffer 25, and the clock generating circuit 44 are the same as the corresponding circuits illustrated in FIG. 11, and a description thereof will be omitted.

The selector 45 includes NMOS transistors 131 through 134. The ideal waveform generating circuit 15 includes NMOS transistors 135 through 137 and resistors R7 and R8. The waveform comparing circuit 12 includes NMOS transistors 138 through 141. The selector 46 includes NMOS transistors 142 and 143. The selectors 45 and 46 perform switchover operations by controlling the conductive and nonconductive states of the NMOS transistors provided therein.

The circuit portion comprised of resistors R10 and R11 and a capacitor C10 serves to integrate the clock signals clk1 and clk1x supplied from the buffer 25 via the selector 45 to generate a voltage value responsive to the signal center voltage at one end of the capacitor C10. This voltage is supplied to the waveform comparing circuit 12. The ideal waveform generating circuit 15 generates an ideal value of the center voltage for provision to the waveform comparing circuit 12. The waveform comparing circuit 12 compares the voltage supplied from the ideal waveform generating circuit 15 with the voltage supplied from the capacitor C10 to supply a voltage responsive to which one of these voltages is greater to the check circuit 23 via the selector 46.

Figure 14:
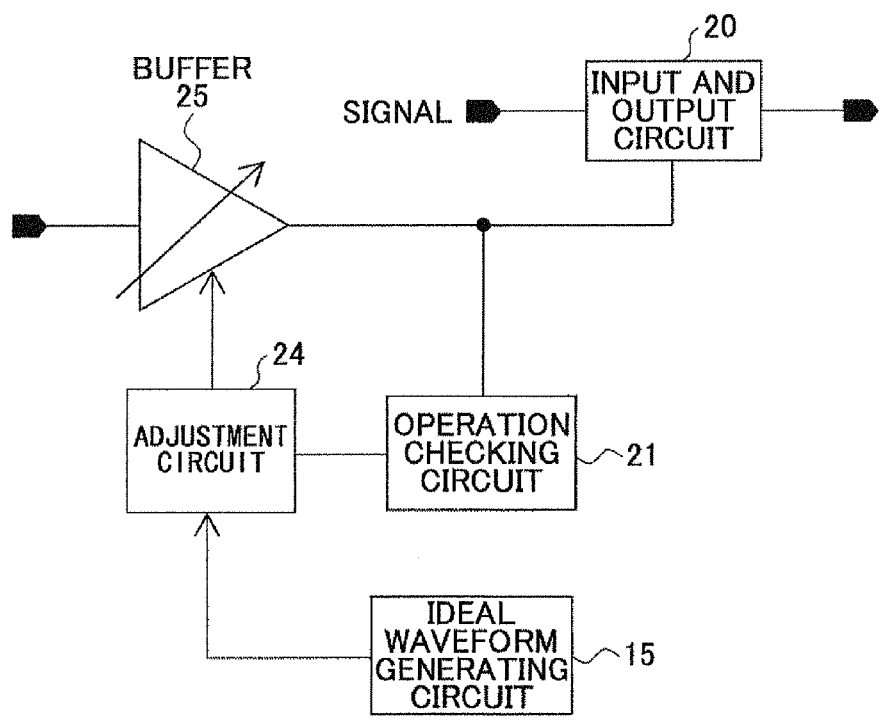
FIG. 14 is a drawing illustrating the configuration of an eighth embodiment of the input and output circuit apparatus.

FIG. 14 is a drawing illustrating the configuration of an eighth embodiment of the input and output circuit apparatus. In FIG. 14, the same elements as those of FIG. 1 and FIG. 2 are referred to by the same numerals, and a description thereof will be omitted.

An input and output circuit apparatus of FIG. 14 includes the ideal waveform generating circuit 15, the input and output circuit 20, the operation checking circuit 21, the adjustment circuit 24, and the buffer 25. The configuration illustrated in FIG. 12 is provided with the operation checking circuit 21 operating according to the description illustrated in FIG. 2, and is also provided with the ideal waveform generating circuit 15 of the related-art configuration illustrated in FIG. 1. Either of these is used to adjust the buffer 25 via the adjustment circuit 24.

The signal adjustment function of the ideal waveform generating circuit 15 is used to make a coarse setting to signals at the time of start of an operation, and the signal adjustment function of the operation checking circuit 21 is used to make a fine setting to the signals. With this arrangement, it is possible to shorten a time length that is required for signal adjustment.

Figure 15:
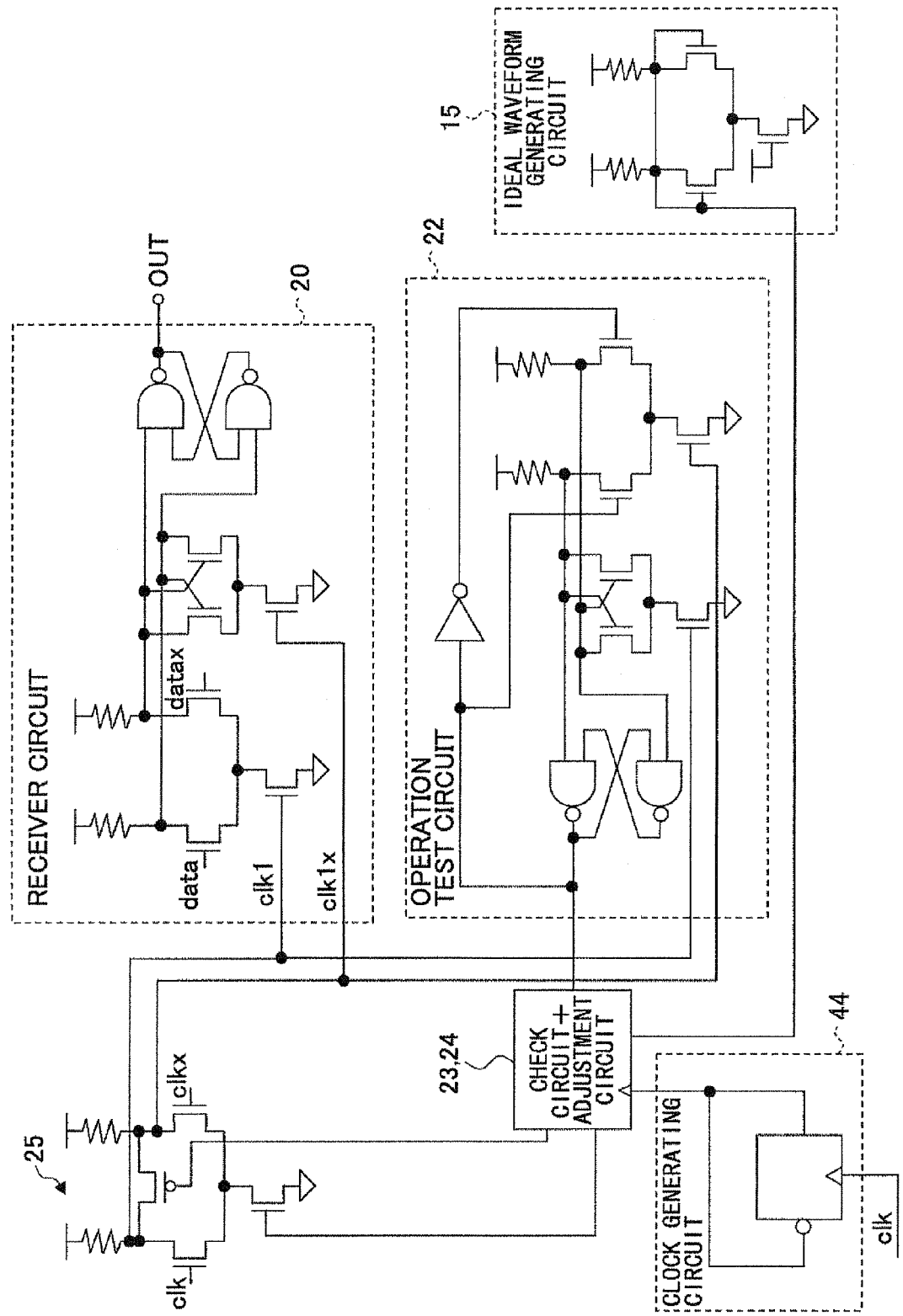
FIG. 15 is a drawing illustrating an example of a specific circuit configuration of the input and output circuit apparatus of FIG. 14.

FIG. 15 is a drawing illustrating an example of a specific circuit configuration of the input and output circuit apparatus of FIG. 14. In the input and output circuit apparatus illustrated in FIG. 15, the input and output circuit 20, the operation test circuit 22, the check circuit 23, the adjustment circuit 24, the buffer 25, and the clock generating circuit 44 are the same as the corresponding circuits illustrated in FIG. 11, and a description thereof will be omitted. The circuit configuration of the ideal waveform generating circuit 15 is the same as that of the ideal waveform generating circuit 15 illustrated in FIG. 13.

The ideal waveform generating circuit 15 includes NMOS transistors 135 through 137 and resistors R7 and R8. The ideal waveform generating circuit 15 generates an ideal value of the center voltage (or amplitude voltage) for provision to the adjustment circuit 24. The adjustment circuit 24 used in this example is a type that controls the buffer 25 in response to an analog voltage input. The adjustment circuit 24 has a switchover function at the input thereof, and controls the buffer 25 based on either the output of the check circuit 23 or the output of the ideal waveform generating circuit 15. When the output of the ideal waveform generating circuit 15 is selected, the adjustment circuit 24 may control the buffer 25 such that the center voltage (or amplitude voltage) of the clock signals clk1 and clk1x output from the buffer 25 is initially set equal to the ideal value of the center voltage (or amplitude voltage) generated by the ideal waveform generating circuit 15.

Figure 16:
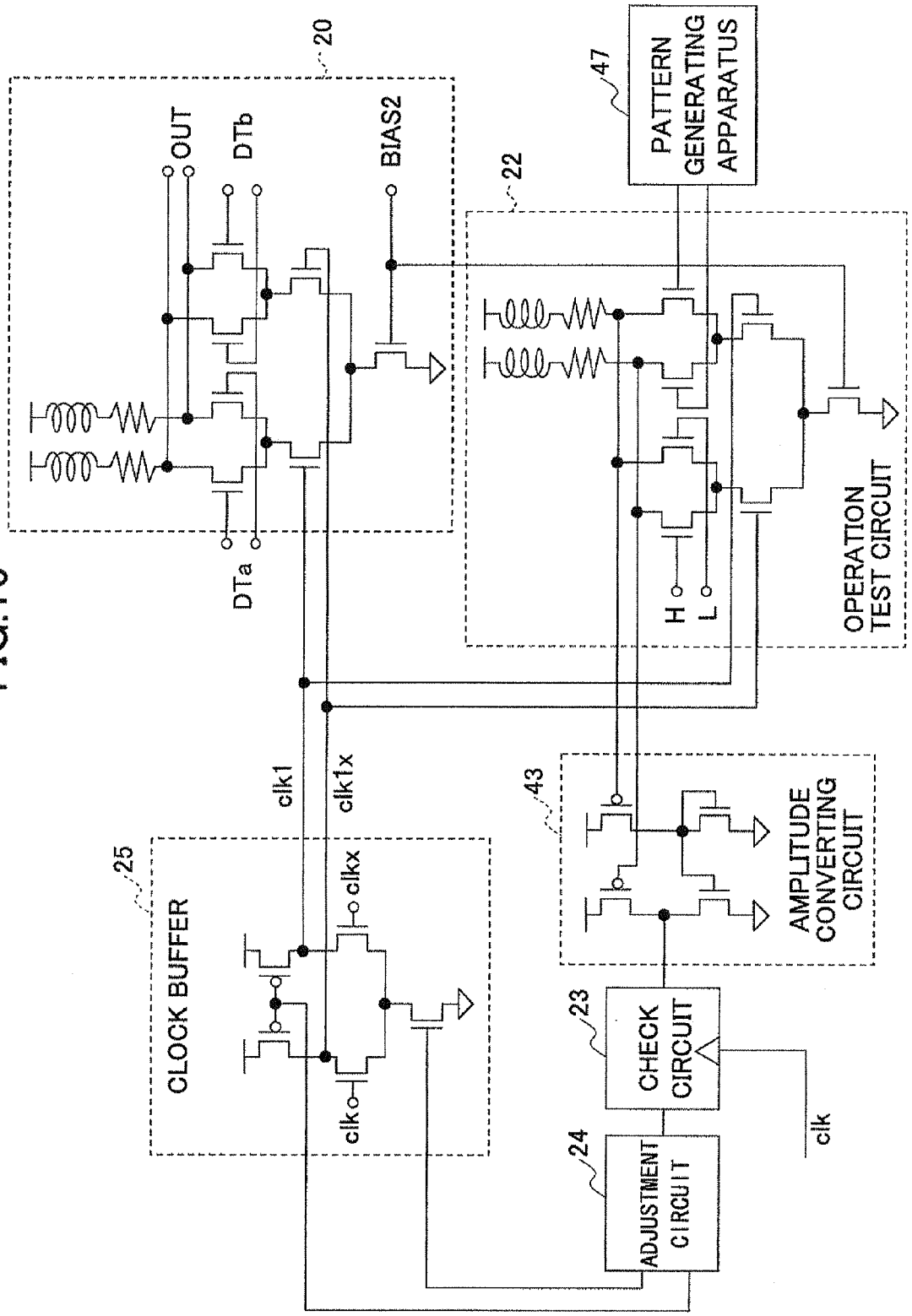
FIG. 16 is a drawing illustrating the configuration of a variation of the fifth embodiment of the input and output circuit.

FIG. 16 is a drawing illustrating the configuration of a variation of the fifth embodiment of the input and output circuit apparatus. In FIG. 16, the same elements as those of FIG. 7 are referred to by the same numerals, and a description thereof will be omitted.

The input and output circuit apparatus illustrated in FIG. 16 differs from the input and output circuit apparatus illustrated in FIG. 7 in that a pattern generating apparatus 47 is provided. The pattern generating apparatus 47 generates a data input signal that is to be supplied to the operation test circuit 22. The data input signal may be a static signal or dynamically changing signal. The input and output circuit 20 that is a 2-to-1 multiplexer has operating patterns that are difficult to process. For example, a pattern of 101010 . . . is difficult to process as it is a high-frequency signal. In the configuration illustrated in FIG. 16, the pattern generating apparatus 47 generates a pattern that is difficult to process for adjustment of the buffer 25. It is thus possible to adjust the clock signals such that the input and output circuit 20 can properly operate even under hard conditions.

According to at least one embodiment, a check is made as to whether the operation test circuit having substantially the same circuit configuration as the input and output circuit is properly operating, and the adjustment circuit adjusts the signal generating circuit based on the outcome of this check. Manufacturing variation affects the input and output circuit and the operation test circuit in similar manners. If the first signal is adjusted to a proper value to secure a proper operation of the operation test circuit, then, a proper operation of the input and output circuit is also guaranteed even with the presence of manufacturing variation.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. An input and output circuit apparatus, comprising:
   a signal generating circuit configured to generate a first signal;
   an input and output circuit configured to receive the first signal from the signal generating circuit and a second signal to generate an output signal responsive to the first signal and the second signal;
   an operation test circuit having substantially an identical circuit configuration to the input and output circuit, and configured to receive the first signal from the signal generating circuit and a third signal to generate an output signal responsive to the first signal and the third signal;
   a check circuit configured to generates a check signal indicative of an operating condition of the operation test circuit in response to the output signal of the operation test circuit; and
   an adjustment circuit configured to adjust the signal generating circuit in response to the check signal output from the check circuit.

2. The input and output circuit apparatus as claimed in claim 1, wherein the first signal is one of a clock signal, a data signal, and a bias signal.

3. The input and output circuit apparatus as claimed in claim 1, wherein the input and output circuit is identical in size to the operation test circuit.

4. The input and output circuit apparatus as claimed in claim 1, wherein the input and output circuit and the operation test circuit are different in size.

5. The input and output circuit apparatus as claimed in claim 1, wherein the output signal of the operation test circuit exhibits a predetermined number of signal level transitions in a predetermined period, and the check circuit is configured to count the number of signal level transitions occurring in the output signal of the operation test circuit within the predetermined period, to compare the counted number with a predetermined number, and to generate the check signal indicative of the operating condition of the operation test circuit in response to a result of the comparison.

6. The input and output circuit apparatus as claimed in claim 1, further comprising:
   a reference signal generating circuit configured to generate a fourth signal; and
   a comparison circuit configured to receive the first signal from the signal generating circuit and the fourth signal from the reference signal generating circuit to generate a fifth signal responsive to the first signal and the second signal, the adjustment circuit is configured to adjust the signal generating circuit in response to a selected one of the check signal output from the check circuit and the fifth signal output from the comparison circuit.

7. The input and output circuit apparatus as claimed in claim 1, further comprising a reference signal generating circuit configured to generate a fourth signal, wherein the adjustment circuit is configured to adjust the signal generating circuit in response to a selected one of the check signal output from the check circuit and the fourth signal output from the reference signal generating circuit, and is configured to control the signal generating circuit such that a predetermined signal characteristic of the first signal is initially set equal to a value indicated by the fourth signal when the fourth signal is selected as said selected one.

8. The input and output circuit apparatus as claimed in claim 1, wherein the adjustment circuit is configured to adjust a first signal characteristic of the first signal by adjusting the signal generating circuit in response to the check signal, and is configured to adjust a second signal characteristic of the first signal by adjusting the signal generating circuit in response to the check signal after a completion of the adjustment of the first signal characteristic.

9. The input and output circuit apparatus as claimed in claim 1, wherein the third signal that is received by the operation test circuit has a fixed signal level.

10. The input and output circuit apparatus as claimed in claim 1, further comprising a pattern generating circuit configured to generate the third signal that is received by the operation test circuit.

* * * * *